US009595917B2

(12) United States Patent
Kan et al.

(10) Patent No.: US 9,595,917 B2
(45) Date of Patent: Mar. 14, 2017

(54) ANTIFERROMAGNETICALLY COUPLED SPIN-TORQUE OSCILLATOR WITH HARD PERPENDICULAR POLARIZER

(71) Applicant: QUALCOMM Incorporated, San Diego, CA (US)

(72) Inventors: Jimmy Kan, San Diego, CA (US); Kangho Lee, San Diego, CA (US); Seung Hyuk Kang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/818,549

(22) Filed: Aug. 5, 2015

(65) Prior Publication Data

US 2017/0040945 A1   Feb. 9, 2017

(51) Int. Cl.
| | |
|---|---|
| G11B 5/31 | (2006.01) |
| H03B 15/00 | (2006.01) |
| G11B 5/35 | (2006.01) |
| G11B 5/00 | (2006.01) |

(52) U.S. Cl.
CPC ........... *H03B 15/006* (2013.01); *G11B 5/314* (2013.01); *G11B 5/3146* (2013.01); *G11B 5/35* (2013.01); *G11B 2005/0024* (2013.01)

(58) Field of Classification Search
CPC .......... G11B 2005/0024; G11B 5/1278; G11B 5/314; G11B 5/3146; G11B 2005/0005; G11B 5/3133; G11B 5/35; G01R 33/1284; H01L 43/08; H03B 15/006; H03B 28/00

USPC .................. 360/125.3, 128; 331/94.1, 107 R
See application file for complete search history.

(56) References Cited

U.S. PATENT DOCUMENTS

| | | | |
|---|---|---|---|
| 7,880,209 B2 | 2/2011 | Xi et al. | |
| 8,421,545 B2 | 4/2013 | Kim et al. | |
| 8,462,461 B2* | 6/2013 | Braganca ............. | G01R 33/093 360/125.3 |
| 8,582,240 B1* | 11/2013 | Chen ...................... | G11B 5/399 360/125.3 |
| 8,675,309 B2* | 3/2014 | Braganca ............. | G01R 33/093 331/94.1 |
| 8,687,319 B2* | 4/2014 | Igarashi ............... | G11B 5/1278 360/125.03 |
| 8,724,261 B2* | 5/2014 | Suto ...................... | G11B 5/187 360/125.3 |
| 8,902,544 B2* | 12/2014 | Braganca .................. | 360/125.3 |

(Continued)

OTHER PUBLICATIONS

Houssameddine, D., et al., Spin-Torque Oscillator Using a Perpendicular Polarizer and a Planar Free Layer, Nature Materials, Apr. 29, 2007, vol. 6, Nature Publishing Group, London, U.K., pp. 447-453.

(Continued)

*Primary Examiner* — Will J Klimowicz
(74) *Attorney, Agent, or Firm* — Toler Law Group, PC

(57) ABSTRACT

An apparatus includes a polarizer, a first free layer, a second free layer, and an antiferromagnetic (AF) coupling layer. The polarizer has a perpendicular magnetic anisotropy (PMA). The polarizer, the first free layer, the second free layer, and the AF coupling layer are included in a spin-torque oscillator (STO). The AF coupling layer is positioned between the first free layer and the second free layer.

20 Claims, 5 Drawing Sheets

(56) References Cited

U.S. PATENT DOCUMENTS

| | | | | |
|---|---|---|---|---|
| 2008/0268291 | A1* | 10/2008 | Akiyama | G11B 5/02 428/812 |
| 2008/0304176 | A1* | 12/2008 | Takagishi | G11B 5/1278 360/86 |
| 2010/0195247 | A1* | 8/2010 | Mochizuki | G11B 5/314 360/123.01 |
| 2011/0216436 | A1* | 9/2011 | Igarashi | G11B 5/314 360/61 |
| 2013/0009712 | A1* | 1/2013 | Braganca | G01R 33/093 331/94.1 |
| 2013/0069626 | A1* | 3/2013 | Zhou | G01R 33/1284 324/76.39 |
| 2013/0070367 | A1* | 3/2013 | Igarashi | G11B 5/1278 360/75 |
| 2013/0077391 | A1 | 3/2013 | Luo et al. | |
| 2013/0120875 | A1* | 5/2013 | Suto | G11B 5/187 360/123.01 |
| 2014/0145792 | A1 | 5/2014 | Wang et al. | |
| 2014/0168812 | A1 | 6/2014 | Braganca et al. | |

OTHER PUBLICATIONS

Braganca P M., et al., "Zero Field High Frequency Oscillations in Dual Free Layer Spin Torque Oscillators", Applied Physics Letters, A I P Publishing LLC, US, vol. 103, No. 23, Dec. 2, 2013 (Dec. 2, 2013), XP012179005, 4 pages, ISSN: 0003-6951, DOI: 10.106311. 4838655 [retrieved on Jan. 1, 1901] abstract.

International Search Report and Written Opinion—PCT/US2016/041570—ISA/EPO—Sep. 16, 2016.

Klein C., et al., "Interplay Between Non Equilibrium and Equilibrium Spin Torque using Synthetic Ferrimagnets", Arxiv.Org, Cornell University Library, 201 Olin Library Cornell University Ithaca, NY 14853, Sep. 13, 2011 (Sep. 13, 2011), 5 pages, XP080527304, DOI: 10.1103/Physrevlett.108.086601 abstract.

Rowlands G E., et aL, "Magnetization Dynamics in a Dual Free-Layer Spin-Torque Nano-Oscillator", Physical Review. B, Condensed Matter and Materials Physics, vol. 86, No. 9, Sep. 1, 2012 (Sep. 1, 2012), 8 pages, XP055300879, US ISSN: 1098-0121, DOI: 10.1103/PhysRevB.86.094425 pp. 094425-1-094425-5.

\* cited by examiner

ANTIFERROMAGNETICALLY COUPLED SPIN-TORQUE OSCILLATOR WITH HARD PERPENDICULAR POLARIZER

I. FIELD

This disclosure is generally related to oscillator devices and more particularly to spin-torque oscillator devices.

II. DESCRIPTION OF RELATED ART

An electronic device may include an oscillator to generate an oscillating signal. For example, a computer may include a circuit that generates a clock signal that is applied to digital logic circuitry of the computer, such as a processor. As another example, a mobile device may adjust a frequency of an oscillator to "tune" to different receive frequencies and transmit frequencies to communicate with other devices of a communication network.

Electronic devices may use inductor-capacitor (LC) "tank" oscillators to generate oscillation signals. LC tank oscillators may be associated with relatively low phase noise. However, LC tank oscillators may have high power consumption, which may be disadvantageous in a mobile device application. Further, LC tank oscillators may occupy a large circuit area. Other electronic devices may use crystal oscillators or complementary metal-oxide-semiconductor (CMOS) oscillators, such as a CMOS ring oscillator. These circuits may occupy less circuit area than LC tank oscillators but may also have high power consumption.

Some devices include spin-torque oscillators (STOs) that use a spin-torque effect to generate oscillation signals. In an STO, a spin-torque effect may be used to generate an oscillation signal (i.e., by opposing a damping torque to create a gyromagnetic oscillation about an effective field axis). However, STOs are not currently widely implemented in electronic devices. For example, standard STOs may be associated with low output power and high phase noise, which may be undesirable in certain applications.

III. SUMMARY

A spin torque oscillator (STO) includes a first free layer, a second free layer, and an antiferromagnetic (AF) coupling layer. The first free layer, the second free layer, and the AF coupling layer may form a magnetically "soft" oscillation region having a relatively low coercivity. The magnetically soft oscillation region may have a magnetic moment that oscillates in response to an input signal of the STO. As a result, a resistance of the STO changes based on the magnetically soft oscillating region, and an output signal generated by the STO may have a value that oscillates relative to the input signal.

In a particular example, the low anisotropy of the magnetically soft oscillating region enables magnetic moments of the free layers to have oscillation angles that are greater than in other STO devices. The greater oscillation angles may reduce a frequency of oscillation associated with the magnetic moment of the magnetically soft oscillating region. For example, an STO device with a relative small angle may have a smaller "swing," resulting in a higher frequency (i.e., more oscillations per time interval). In accordance with the disclosure, magnetic moments of free layers of an STO may have greater oscillation angles that increase "swing," resulting in a lower frequency (i.e., fewer oscillations per time interval relative to other STO devices).

The STO may therefore be suitable for radio frequency (RF) communications applications, such as applications that utilize frequencies within a 500 megahertz (MHz) to 6 gigahertz (GHz) frequency range. As a result, the STO may be advantageous for a consumer radio application, such as Bluetooth® (Bluetooth® is a registered trademark of Bluetooth Special Interest Group (SIG), Inc.) or an Institute of Electrical and Electronics Engineers (IEEE) 802.11 radio application. Other STO devices may operate at a frequency of 10 GHz or more, which may be too high for a consumer radio application. As a result, implementation of such STO devices may be impracticable in some applications (e.g., in a mobile device, such as a cellular phone).

Further, the STO may be more power-efficient and may occupy less device area relative to other oscillators. For example, an LC tank circuit may occupy large circuit area (e.g., to accommodate one or more inductors of the tank circuit) and may have a high power consumption. A crystal oscillator and a ring oscillator may also occupy large device area and/or may have high power consumption. Therefore, in an illustrative configuration, an STO in accordance with the disclosure may be implemented as a power-efficient and size-efficient oscillator for a consumer radio application (e.g., a mobile device, such as a cellular phone). In other configurations, the STO may be implemented in one or more other electronic devices.

In a particular example, an apparatus includes a polarizer having a perpendicular magnetic anisotropy (PMA). The apparatus further includes a first free layer, a second free layer, and an antiferromagnetic (AF) coupling layer. The polarizer, the first free layer, the second free layer, and the AF coupling layer are included in a spin-torque oscillator (STO). The AF coupling layer is positioned between the first free layer and the second free layer.

In another example, an apparatus includes means for perpendicularly polarizing electrons and means for generating a first oscillating magnetic moment. The apparatus further includes means for generating a second oscillating magnetic moment and means for antiferromagnetically coupling the means for generating the first oscillating magnetic moment and the means for generating the second oscillating magnetic moment. The means for perpendicularly polarizing, the means for generating the first oscillating magnetic moment, the means for generating the second oscillating magnetic moment, and the means for antiferromagnetically coupling are included in a spin-torque oscillator (STO).

In another example, a method of operation of a spin-torque oscillator (STO) includes biasing a polarizer of the STO using a bias signal. The polarizer has a perpendicular magnetic anisotropy (PMA). The method further includes generating an oscillation signal based on the bias signal using a region of the STO. For example, the region may include a first free layer and a second free layer, and the oscillation signal may oscillate with a large in-plane angular component. The region includes a first free layer, a second free layer, and an antiferromagnetic (AF) coupling layer.

One particular advantage provided by at least one of the disclosed devices is improved performance of an oscillator. For example, an STO in accordance with the disclosure may exhibit certain desirable radio frequency (RF) properties (e.g., frequency range, Q-factor, phase noise, and/or one or more other properties) while also reducing power consumption (e.g., by a factor of 10, such as from approximately 10 milliwatts to less than one milliwatt) as compared to other oscillator devices. The STO may have a smaller size than other oscillator devices (e.g., one-tenth a size of certain LC tank oscillators). The STO may also have better properties than other STO devices (e.g., output power, phase noise, Q-factor, and stability against dephasing, as illustrative examples). Other aspects, advantages, and features of the disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
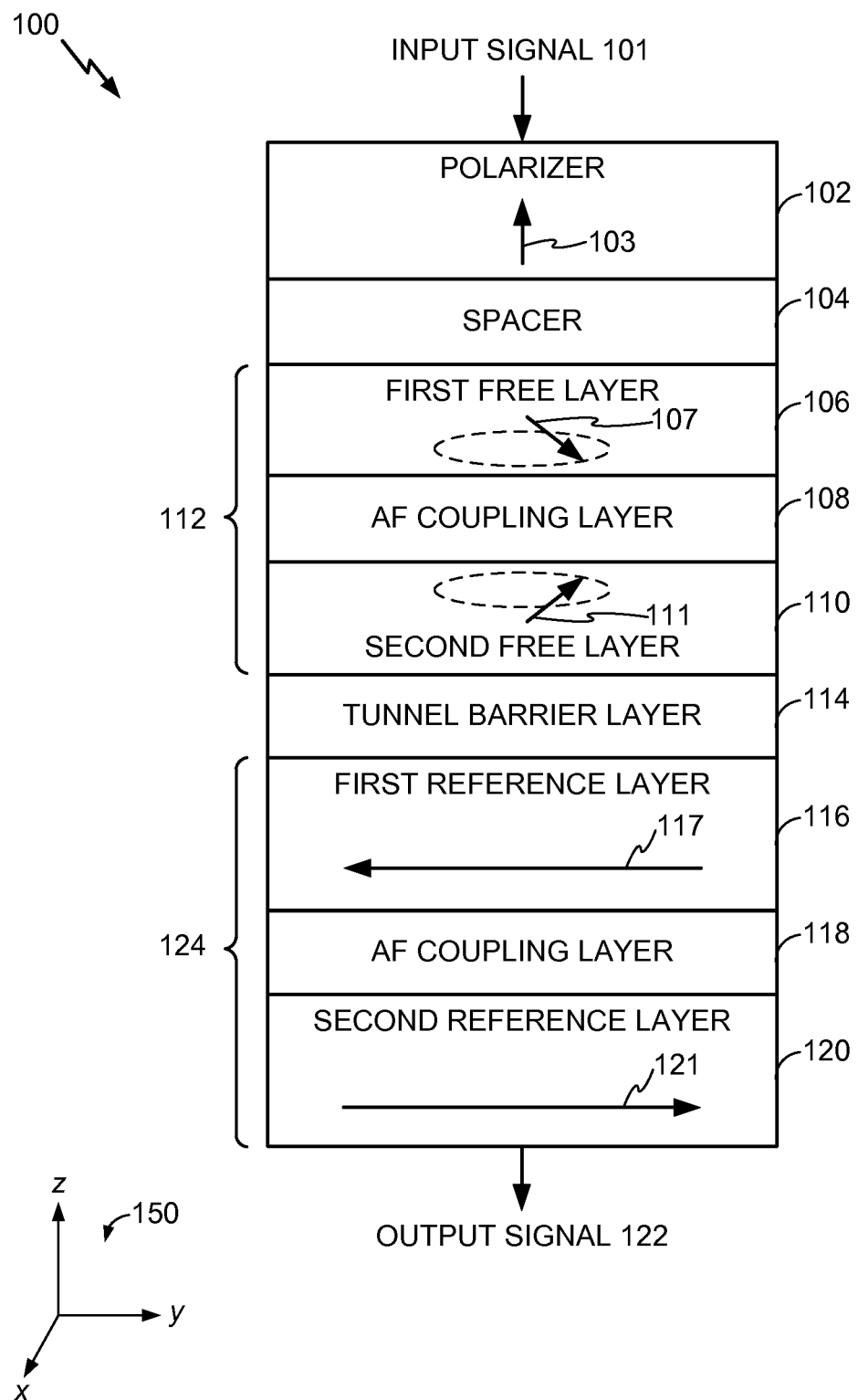
FIG. 1 is a block diagram of a particular illustrative example of a spin-torque oscillator.

FIG. 1 illustrates a spin-torque oscillator (STO) 100. The STO 100 includes a polarizer 102, a spacer 104, a first free layer 106, an antiferromagnetic (AF) coupling layer 108, and a second free layer 110. The AF coupling layer 108 is positioned between the free layers 106, 110. The first free layer 106, the AF coupling layer 108, and the second free layer 110 form a magnetically soft oscillating region 112.

The STO 100 further includes a tunnel barrier layer 114, a first reference layer 116 (also referred to as a "fixed" or pinned layer), an AF coupling layer 118, and a second reference layer 120. The reference layers 116, 120 and the AF coupling layer 118 may form a magnetically hard region 124. For convenience of description, FIG. 1 also illustrates a coordinate system 150 having an x-axis, a y-axis, and a z-axis.

The polarizer 102 may have a perpendicular magnetic anisotropy (PMA). For example, FIG. 1 illustrates that the polarizer 102 may have a moment 103 that is oriented (or substantially oriented) in the z-direction. As used herein, "perpendicular" may refer to a direction that is normal to a surface of a substrate on which the STO 100 is formed. For example, the surface may correspond to the x-y plane, and the z-axis is normal to the x-y plane. The polarizer 102 may be a ferromagnet, such as a moderate damping ferromagnet. The polarizer 102 may include one or more magnetically "hard" materials having a high anisotropy. As illustrative examples, the polarizer 102 may include cobalt and platinum based multilayers/alloys or cobalt and nickel based multilayers/alloys. Alternatively, the polarizer 102 may include alloys containing rare earth elements and ferromagnetic elements. The polarizer 102 may be configured to cause magnetic moments of the free layers 106, 110 to oscillate (e.g., to prevent the magnetic moments from "settling" into a "preferred" direction), as described further below.

The spacer 104 may include a conductive material, such as one or more metal materials. For example, the spacer 104 may include copper (Cu), chromium (Cr), gold (Au), and/or another material. The spacer 104 may be a spin-selective spacer layer. The spacer 104 is connected to the polarizer 102 and to the first free layer 106.

The first free layer 106 may have a magnetic moment 107. In a particular embodiment, the first free layer 106 includes one or more ferromagnetic materials, such as a magnetically soft isotropic ferromagnetic material. In a particular implementation, the first free layer 106 includes an alloy, such a nickel-iron (NiFe) alloy. Alternatively or in addition, the first free layer 106 may include another high permeability magnetic material.

The AF coupling layer 108 may be configured to induce an antiferromagnetic state between the free layers 106, 110, such as by using an oscillatory antiferromagnetic coupling effect. For example, the AF coupling layer 108 may include a strong AF exchange material in the thickness range of 2-16 Angstroms. The AF coupling layer 108 may include one or more metal materials, such as iridium (Ir), ruthenium (Ru), and/or chromium (Cr), as illustrative examples. In some applications, such a strong AF exchange material may reduce or suppress certain multimode oscillations of the STO 100 and the free layers 106, 110.

The second free layer 110 may have a magnetic moment 111. The first free layer 106 and the second free layer 110 may have in-plane magnetic anisotropies that can be "tilted" as a result of current flowing through the polarizer 102. For example, the second free layer 110 may have a partial PMA as a result of the PMA of the polarizer 102. In this example, the magnetic moment 111 may include vector components in both the y-direction and the z-direction (instead of including primarily a z-direction component). The partial PMA causes the second free layer 110 to cancel approximately $4*\pi*Ms$ electromagnetic units (emu), where Ms indicates a magnetization parameter (e.g., a parameter indicating a magnetic density associated with the second free layer 110). The second free layer 110 may include an iron-based material, such as a cobalt-iron-boron (CoFeB) material, a cobalt-iron (CoFe) material, and/or elemental iron (Fe), as illustrative examples.

The magnetically soft oscillating region 112 may function as a magnetically soft region having a low coercivity. For example, materials of the free layers 106, 110 and the AF coupling layer 108 may be selected so that the magnetically soft oscillating region 112 has a high susceptibility to spin-torque from the polarizer 102 (i.e., functions as a magnetically "soft" material). For example, the magnetically soft oscillating region 112 may have a coercivity of less than 50 oersted (Oe) (e.g., 10 Oe or less, or 1 Oe or less, as illustrative examples).

The tunnel barrier layer 114 may be configured to enable a tunneling magnetoresistance effect between the second free layer 110 to the first reference layer 116. The magnetically soft oscillating region 112, the tunnel barrier layer 114, and the magnetically hard region 124 may form a metallic spin valve device or a magnetic tunnel junction (MTJ) device. The tunnel barrier layer 114 may have a high tunneling magnetoresistance (e.g., 150% or greater) and a low resistance-times-area (RA) product. The tunnel barrier layer 114 may include a magnesium-oxide (MgO) material, an aluminum oxide (AlO) material, and/or another material, as illustrative examples.

The first reference layer 116 may have a magnetic moment 117. In a particular embodiment, the first reference layer 116 has an in-plane magnetic anisotropy, and the magnetic moment 117 is oriented (or substantially oriented) in-plane. The first reference layer 116 may include an iron-based material, such as a cobalt-iron (CoFe) material and/or elemental iron (Fe), as illustrative examples. The first reference layer 116 may have a lattice-type structure, such as a body-centered-cubic (BCC) 001 structure.

The AF coupling layer 118 may be configured to induce an antiferromagnetic state between the reference layers 116, 120, such as using an oscillatory antiferromagnetic coupling effect. For example, the AF coupling layer 118 may include a strong AF exchange material, such as iridium (Ir), ruthenium (Ru), and/or chromium (Cr) in the thickness range of 2-16 Angstroms, as illustrative examples.

The second reference layer 120 may have a magnetic moment 121. In a particular embodiment, the second reference layer 120 has an in-plane magnetic anisotropy, and the magnetic moment 121 is oriented (or substantially oriented) antiparallel to the magnetic moment 117 of the first reference layer 116. As used herein, "in-plane" may refer to a direction that is parallel to a surface of a substrate on which the STO 100 is formed. For example, the y-axis is parallel to the surface of the substrate. The second reference layer 120 may include an iron-based material, such as a cobalt-iron (CoFe) material and/or elemental iron (Fe), as illustrative examples.

The STO 100 may have a particular geometry, such as a pillar geometry or a circular geometry, as illustrative examples. In a particular embodiment, the STO 100 is symmetric (or substantially symmetric) in the x-direction and in the y-direction. In an illustrative implementation, the STO 100 has a diameter of approximately 50 nanometers (nm) with respect to the y-direction. In other cases, the STO may have a diameter of more than 50 nm or less than 50 nm.

During operation, the STO 100 may be responsive to a signal, such as an input signal 101. For example, the input signal 101 may be applied to the polarizer 102 via an electrode or another conductive device. The input signal 101 may be a bias signal, such as a direct current (DC) bias signal, as an illustrative example. In a particular embodiment, the input signal 101 has a current magnitude within a range of from approximately 10 microamperes ($\mu A$) to approximately 300 $\mu A$ (e.g., 140 $\mu A$, as an illustrative example).

The polarizer 102 may be configured to spin-polarize the input signal 101. For example, the polarizer 102 may be configured to spin-polarize electrons of the input signal 101 so that the electrons may exert a spin-torque on subsequent magnetic layers. The spin-polarized electrons may be provided without spin-coherency loss to the first free layer 106 (e.g., via the spacer 104).

The AF coupling layer 108 is configured to cause the magnetic moment 107 of the first free layer 106 to oscillate in a first direction that is different than a second direction of oscillation of the magnetic moment 111 of the second free layer 110. For example, z-direction components of the magnetic moments 107, 111 may have opposite signs (positive and negative). The x-direction components and y-direction components of the magnetic moments 107, 111 may oscillate (e.g., from plus to minus a particular value). The x-direction components and y-direction components of the magnetic moments 107, 111 may be anti-symmetric. Thus, the magnetic moments 107, 111 may oscillate about the z-axis.

Because the magnetic moments 107, 111 have vector components in both the x-y-direction and the z-direction, the free layers 106, 110 have magnetic characteristics that are partially perpendicular and partially in-plane. To illustrate, the free layers 106, 110 may include materials that enable in-plane anisotropies (substantially in the x-y-direction), which may be partially oriented in the perpendicular direction (partially in the z-direction) as a result of an antiferromagnetic effect of the AF coupling layer 108 and/or based on a spin-torque current effect of the polarizer 102. Thus, the free layers 106, 110 may have partial PMA. The magnetic moments 107, 111 may have relatively large angles with respect to the z-axis. Depending on the particular application, angles of the magnetic moments 107, 111 relative to the z-axis may be greater than 45 degrees (e.g., 60 degrees, 70 degrees, or another angle). In some implementations, the free layers 106, 110 have low or zero anisotropy (e.g., no particular magnetic anisotropy).

Thus, biasing the polarizer 102 using the input signal 101 may cause the magnetically soft oscillating region 112 to have an oscillating magnetic moments (the magnetic moments 107, 111). The magnetic moment 111 may oscillate at an angle with respect to the z-axis (and may have substantial components in the xy-plane). As a result, a resistance of the STO 100 changes due the magnetoresistance effect between the magnetically soft oscillating region 112 and the first reference layer 116. Thus, an output signal 122 generated at the second reference layer 120 may have a value (e.g., a voltage and/or a current) that oscillates relative to the input signal 101. The output signal 122 may be an alternating current (AC) signal, such as a sinusoid, as an illustrative example. In a particular embodiment, the output signal 122 has a frequency in a range between 500 megahertz (MHz) and 6 gigahertz (GHz).

The output signal 122 may be provided to an electrode or to another conductive device. The output signal 122 can be used in one or more applications. To illustrate, the STO 100 may function as a local oscillator (LO) of an electronic device, such as a mobile device. As an illustrative example, the STO 100 may be integrated within a transceiver of a cellular telephone. In a particular embodiment, the STO 100 is integrated within a local oscillator (LO) of an electronic device. For example, as described further with reference to FIG. 5, an electronic device may include a radio frequency (RF) interface having a LO that includes an STO, such as the STO 100.

Alternatively or in addition, an STO in accordance with the disclosure may be used in connection with one or more other applications. For example, the output signal 122 may function as a timing reference in connection with operation of an analog-to-digital converter (ADC) device. In this example, the ADC device may digitize an analog signal at sampling times using the output signal 122 as a timing reference. Those of skill in the art will recognize other applications that may utilize an oscillation signal. These applications are also within the scope of the disclosure.

In a particular embodiment, the low anisotropy of the magnetically soft oscillating region 112 enables the magnetic moments 107, 111 to have a particular angle (relative to the z-axis) that is greater than in other STO devices. The greater angle may reduce a frequency of oscillation of a magnetic moment of the magnetically soft oscillating region 112. For example, an STO device with a relative small angle has a smaller "swing," resulting in a higher frequency (i.e., more oscillations per time interval). The magnetic moments 107, 111 may have greater angles that increase "swing," resulting in a lower frequency (i.e., fewer oscillations per time interval) but also with larger magnetoresistance effect and thus higher output voltage.

The STO 100 may therefore be suitable for lower frequency applications, such as applications that utilize a 500 megahertz (MHz) to 6 gigahertz (GHz) frequency range. As a result, the STO 100 may be advantageous for a consumer radio application, such as Bluetooth® (Bluetooth® is a registered trademark of Bluetooth Special Interest Group (SIG), Inc.), Long-term Evolution (LTE), Global System for Mobile Communications (GSM), or an Institute of Electrical and Electronics Engineers (IEEE) 802.11 radio application. Other STO devices may operate at frequencies of 10 GHz or more, which may be too high for a consumer radio application.

Further, the STO 100 may be more power-efficient and may occupy less device area relative to other oscillators. For example, an LC tank circuit may occupy a large circuit area (e.g., to accommodate one or more inductors of the tank circuit) and may have a high power consumption. A crystal oscillator and a ring oscillator may also occupy a large device area and/or may have a high power consumption. Therefore, in an illustrative configuration, the STO 100 may be implemented as a power-efficient and size-efficient oscillator for a consumer radio application (e.g., a mobile device).

Although certain oscillation signals have been described with reference to a sinusoidal waveform, it is noted that an oscillation signal may include another waveform. For example, in some applications, the output signal 122 of FIG. 1 may be used to generate another (e.g., non-sinusoidal) waveform. To illustrate, the output signal 122 may be applied to a rectifier circuit, such as a half-wave rectifier circuit. In other cases, an oscillator (e.g., the STO 100) may be used to generate another waveform, such as a rectangular waveform (e.g., a square waveform), a triangular waveform, or a sawtooth waveform, as illustrative examples.

Figure 2:
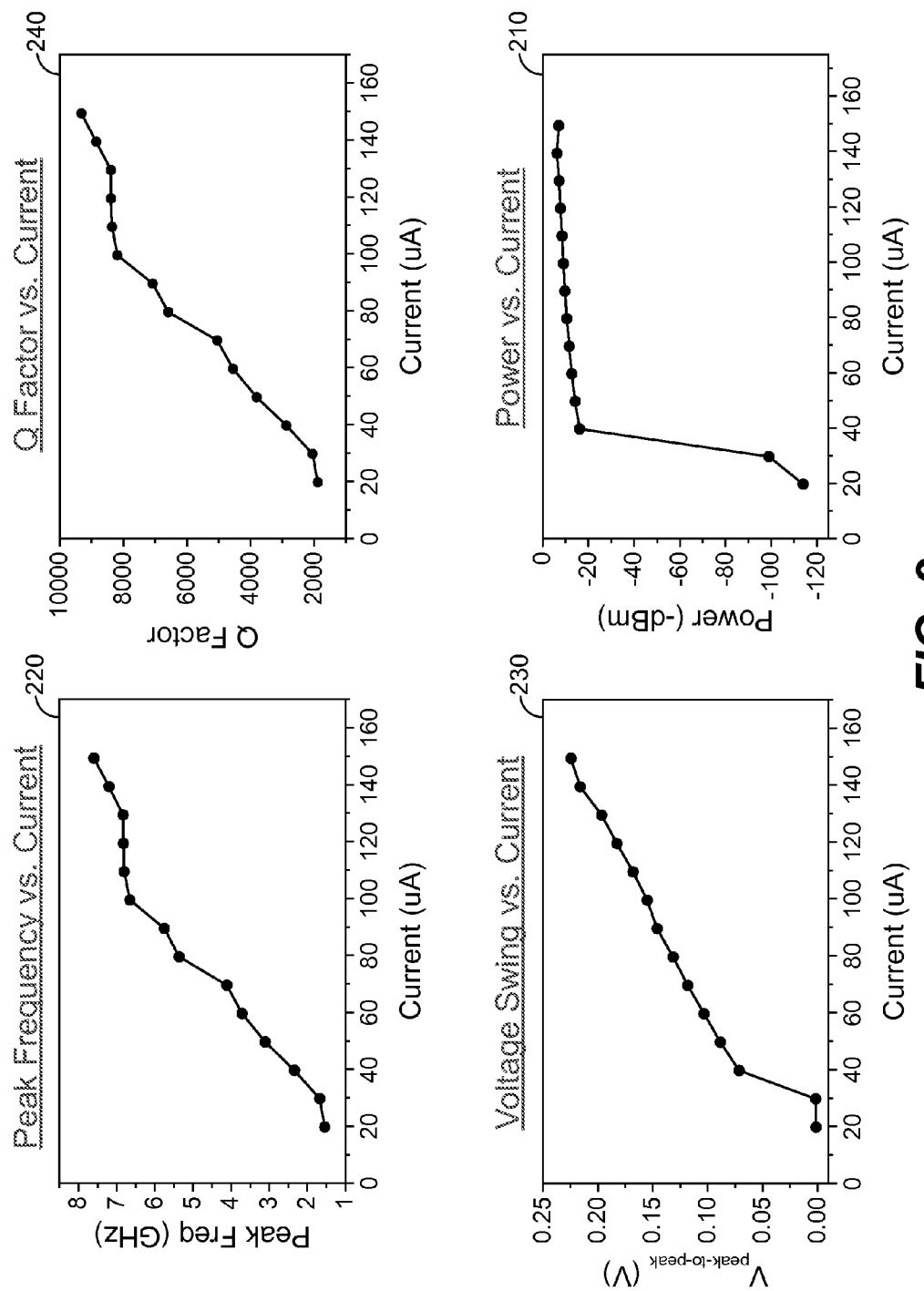
FIG. 2 is a diagram illustrating certain example operational parameters that may be associated with the spin-torque oscillator of FIG. 1.

FIG. 2 illustrates certain example operational parameters that may be associated with an STO, such as the STO 100 of FIG. 1. It should be appreciated that the operational parameters of FIG. 2 are illustrative and that other operational parameters are within the scope of the disclosure. For example, in some applications, the STO 100 of FIG. 1 may have operating parameters different than those illustrated in FIG. 2.

FIG. 2 depicts a graph 210 illustrating example values of current in microamperes (μA) and output power in decibel-milliwatts (dBm). The graph 210 illustrates that an STO in accordance with the disclosure may be associated with a relative low signal attenuation (e.g., power loss) during generation of an oscillation signal by the STO. To illustrate, the input signal 101 may have a current magnitude with a range of between approximately 35 μA and approximately 155 μA. In this example, the output signal 122 relative to the input signal 101 may be approximately −10 dBm.

FIG. 2 also depicts a graph 220 illustrating example values of current in microamperes (μA) and frequency (e.g., "peak" frequency) in gigahertz (GHz). The graph 220 indicates that an STO may have a relatively wide frequency tuning range in which a frequency of the STO can be adjusted by changing input current. To illustrate, a current magnitude of the input signal 101 of FIG. 1 may be adjusted to change (e.g., tune) a frequency of the output signal 122. The graph 220 illustrates an example implementation in which the frequency of the output signal 122 may be tunable over a relatively large frequency range (e.g., from approximately 500 megahertz (MHz) to approximately 8 GHz) for a relatively low current magnitude range of the input signal 101 (e.g., from approximately 20 μA to approximately 155 μA). Thus, the STO 100 may have an output frequency range of approximately 8 GHz.

FIG. 2 further depicts a graph 230 illustrating example values of current in microamperes (μA) and voltage in volts (V) (e.g., "peak" to "peak" voltage (Vpp)). The graph 230 indicates that an STO may have a relatively high output voltage. For example, the graph 230 illustrates that the output signal 122 may have a voltage of approximately 0.2 V or more for a current magnitude of the input signal 101 of approximately 120 μA or more.

FIG. 2 also depicts a graph 240 illustrating example values of current in microamperes (μA) and quality factor (or "Q-factor"). The graph 240 indicates that an STO may have a relatively large Q-factor. For example, a Q-factor associated with the STO 100 may be adjusted within a range of approximately 2,000 to approximately 10,000 (corresponding to a current magnitude range of between approximately 20 μA to approximately 160 μA of the input signal 101).

The examples of FIG. 2 illustrate certain operational parameters that illustrate improved STO performance as compared to other STO devices. For example, the graph 210 illustrates that the output signal may be larger than in other STO devices with lower output power (e.g., −50 dBm or less). As another example, the graph 220 illustrates a relatively large, tunable output frequency range (e.g., approximately 8 GHz) that may serve RF communications, whereas other STO devices may operate outside of this range (e.g., 10 GHz or more). As an additional example, the graph 230 illustrates that an output signal may have a relatively large peak-to-peak voltage (e.g., approximately 0.2 V) relative to other STO devices (e.g., 0.1 V or less). As a further example, the graph 240 illustrates that an STO may be associated with a relatively high-Q factor (e.g., greater than 1,000) as compared to some STO devices (which may have a Q-factor of 1,000 or less).

Figure 3:
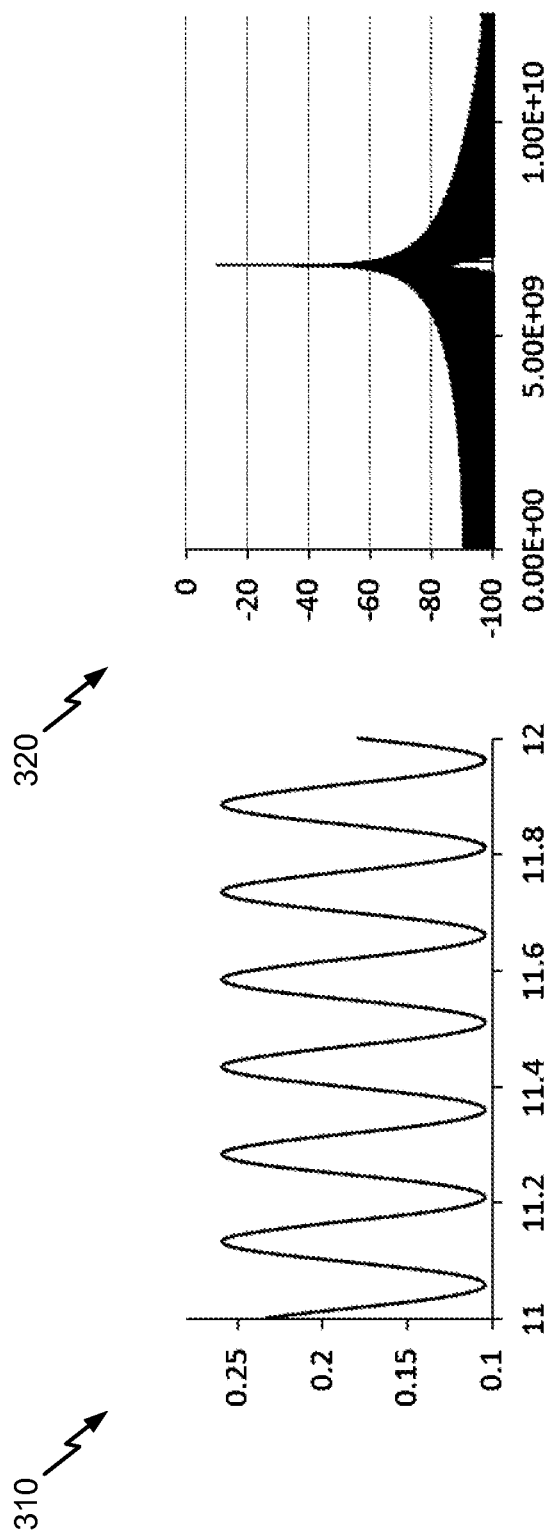
FIG. 3 is a diagram illustrating additional operational parameters that may be associated with the spin-torque oscillator of FIG. 1.

FIG. 3 illustrates certain additional operational parameters that may be associated with an STO, such as the STO 100 of FIG. 1. It should be appreciated that the operational parameters described with reference to FIG. 3 are illustrative and that other operational parameters are within the scope of the disclosure. For example, in some applications, the STO 100 of FIG. 1 may have operational parameters different than those described with reference to FIG. 3. This figure illustrates the oscillatory output of the STO in the time domain and frequency domain.

FIG. 3 depicts an STO output graph 310 illustrating time in nanoseconds (ns) and signal output (e.g., the output signal 122 of FIG. 1) in volts (V). The STO output graph 310 illustrates that the output signal 122 may be a sinusoidal waveform (or may be approximately a sinusoidal waveform).

FIG. 3 also depicts an STO output spectrum graph 320 illustrating frequency in hertz (Hz) and power in decibel-milliwatts (dBm) for an illustrative 50 ohm (Ω) load. The STO output spectrum graph 320 illustrates that, using a particular input current, a sharp power peak in the frequency domain may be obtained. The frequency of the output signal 122 may be selected to enable communication in a wireless communication network, such as within a wireless local area network (WLAN) and/or within a cellular communication network, as illustrative examples. In other applications, the STO 100 may be associated with a different frequency spectrum.

The example of FIG. 3 illustrates that the output signal 122 of the STO 100 may be a sinusoid having a frequency selected to enable communication in a wireless communication network. Further, the output signal having the frequency may be provided while maintaining low power consumption, which may increase performance and/or battery life of an electronic device.

Figure 4:
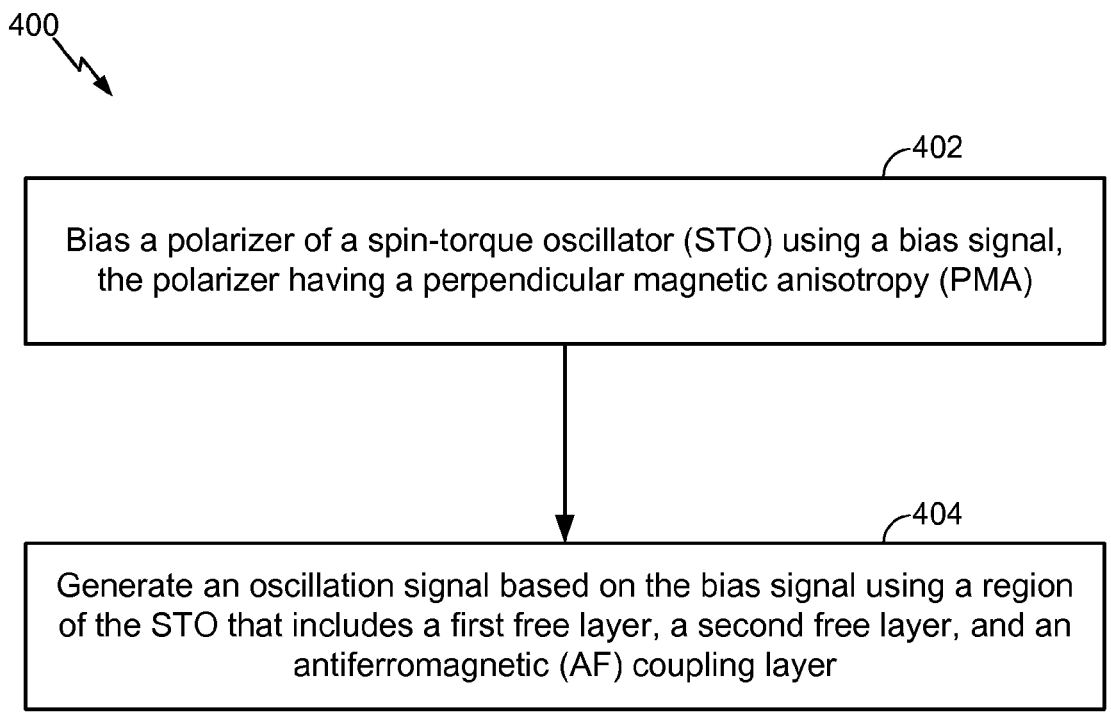
FIG. 4 is a flow chart of a particular illustrative example of a method of operation of the spin-torque oscillator of FIG. 1.

Referring to FIG. 4, a particular illustrative embodiment of a method of operation of a spin-torque oscillator (STO) is depicted and generally designated 400. As an example, the STO may correspond to the STO 100 of FIG. 1.

The method 400 may include biasing a polarizer of the STO using a bias signal, at 402. The polarizer has a perpendicular magnetic anisotropy (PMA). For example, the bias signal may correspond to the input signal 101, and the polarizer may correspond to the polarizer 102. In this example, the polarizer 102 has PMA because the materials chosen for the polarizer 102 have a moment 103 oriented (or substantially oriented) in the z-direction. In a particular embodiment, the polarizer 102 spin-polarizes electrons of the input signal 101, and the spin-polarized electrons are provided to the free layer 106 (e.g., via the spacer 104).

The method 400 further includes generating an oscillation signal based on the bias signal (e.g., based on the spin-polarized electrons of the input signal 101) using a region of the STO that includes a first free layer, a second free layer, and an antiferromagnetic (AF) coupling layer, at 404. For example, the region may correspond to the magnetically soft oscillating region 112, and the oscillation signal may correspond to the output signal 122. In this example, the first free layer may correspond to the first free layer 106, the AF coupling layer may correspond to the AF coupling layer 108, and the second free layer may correspond to the second free layer 110.

In a particular illustrative embodiment, the method 400 further includes generating a first oscillating magnetic moment at the first free layer, generating a second oscillating magnetic moment at the second free layer, and antiferromagnetically coupling the first free layer and the second free layer using the AF coupling layer. For example, the first oscillating magnetic moment may correspond to the magnetic moment 107, and the second oscillating magnetic moment may correspond to the magnetic moment 111. The first free layer, the second free layer, and the AF coupling layer may form a magnetically soft oscillating region of the STO, such as the magnetically soft oscillating region 112.

The oscillation signal may have a frequency that is within a 500 megahertz (MHz) to 6 gigahertz (GHz) frequency range. To illustrate, referring again to FIG. 2, the graph 220 illustrates that a frequency of an output signal of the STO may be controlled based on a current magnitude of a bias signal. In the illustrative example of the graph 220, the current magnitude may be set to a value within a range of approximately 20 to approximately 90 microamperes (μA) to set the frequency of the oscillation signal to within the 500 MHz to 6 GHz frequency range (e.g., 750 MHz, 1 GHz, 2 GHz, 3 GHz, or another frequency). In other implementations, the particular current magnitudes used to select a frequency may be different than in the example of FIG. 2.

The method 400 of FIG. 4 may enable improved performance of an electronic device that includes an oscillator. For example, by performing the method 400 using an STO, power consumption may be reduced as compared to using an LC-tank circuit to generate an oscillation signal.

Figure 5:
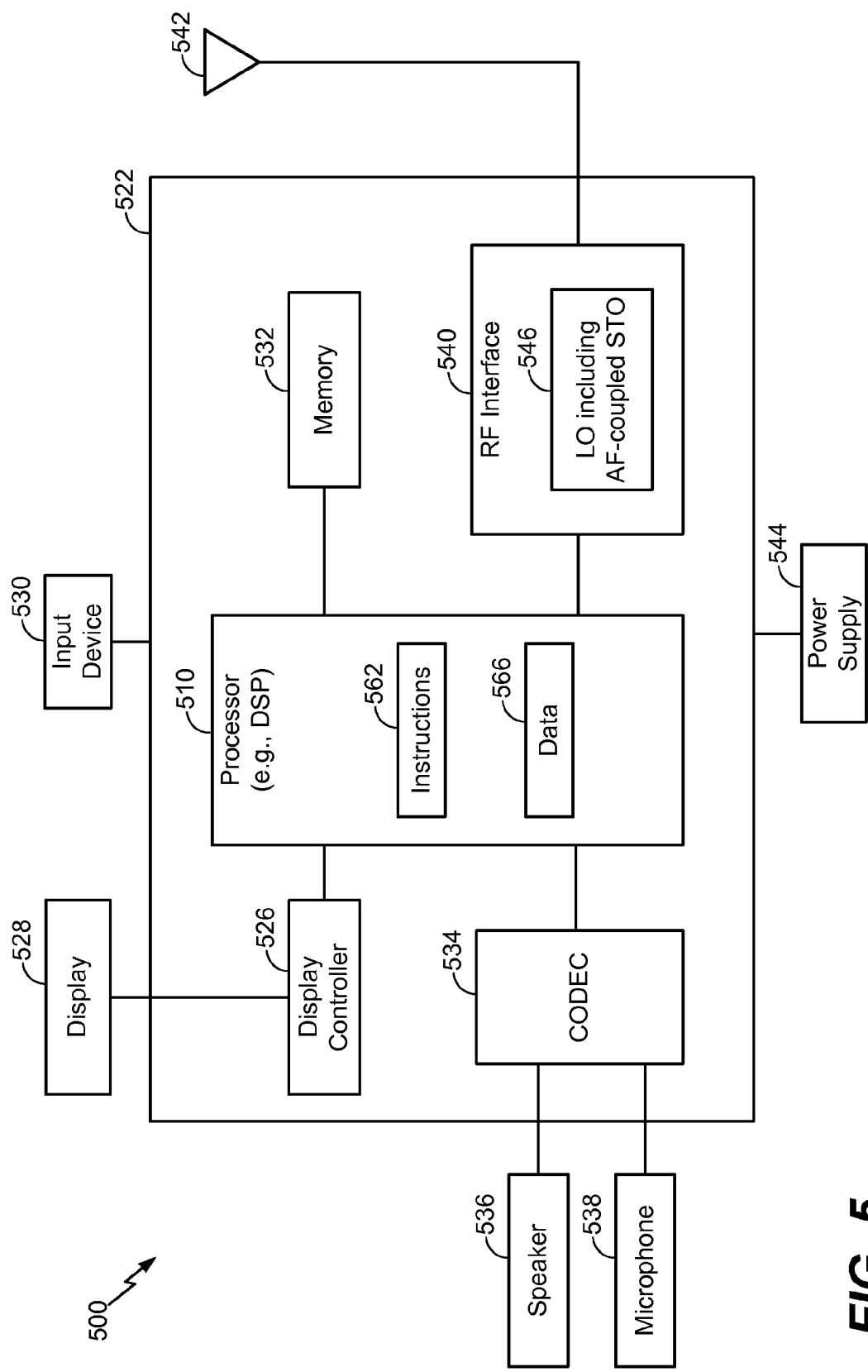
FIG. 5 is a block diagram of a particular illustrative example of a device that includes the spin-torque oscillator of FIG. 1.

Referring to FIG. 5, a block diagram of a particular illustrative embodiment of an electronic device is depicted and generally designated 500. In a particular embodiment, the electronic device 500 is a mobile device (e.g., a cellular telephone). In other implementations, the electronic device may be a computer (e.g., a laptop computer, a tablet computer, or a desktop computer), a navigation device, an audio player, a video player, a television tuner, a radio tuner, or another electronic device that includes one or more oscillators.

The electronic device 500 includes a processor 510, such as a digital signal processor (DSP). The processor 510 may be coupled to a memory 532 (e.g., a computer-readable medium). The memory 532 may include a magnetoresistive random access memory (MRAM) device, as an illustrative example. Alternatively or in addition, the memory 532 may include another memory device. The processor 510 may read and write instructions 562 and/or data 566 at the memory 532.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534.

FIG. 5 further indicates that a radio frequency (RF) interface 540 can be coupled to the processor 510. The RF interface 540 may correspond to a Bluetooth® radio device (Bluetooth® is a registered trademark of Bluetooth Special Interest Group (SIG), Inc.), an LTE radio device, a GSM radio device, or an IEEE 802.11 radio device, as illustrative examples. In FIG. 5, the RF interface 540 includes a local oscillator (LO) 546 having an AF-coupled STO. The AF-coupled STO may correspond to the STO 100 of FIG. 1. In an illustrative implementation, the AF-coupled STO is included in a mixer device of the RF interface 540. In a particular embodiment, the AF-coupled STO is configured to generate output signals having frequencies within a radio frequency (RF) communications range, and the RF interface 540 is configured to communicate within one or more communication networks that utilize RF communications. It should be appreciated that one or more other components of an electronic device may include an AF-coupled STO (alternatively or in addition to the LO 546). As an illustrative example, the CODEC 534 may include an analog-to-digital converter (ADC) configured to use an oscillation signal that is generated by an AF-coupled STO (e.g., another AF-coupled STO).

In a particular embodiment, the processor 510, the display controller 526, the memory 532, the CODEC 534, and the RF interface 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as to an interface or to a controller. In some implementations, a radio device may be implemented using another integrated circuit that is coupled to the system-on-chip device 522. For example, in some applications, the RF interface 540 may be implemented in an integrated circuit that is coupled to the system-on-chip device 522 (e.g., to reduce or isolate noise effects of radio frequency signals associated with the RF interface 540). In this example, the system-on-chip device 522 may be coupled to a component of the RF interface 540, such as to an interface or to a controller.

In conjunction with the described embodiments, an apparatus includes means (e.g., the polarizer 102) for perpendicularly polarizing electrons (e.g., electrons of the input signal 101) and means (e.g., the first free layer 106) for generating a first oscillating magnetic moment (e.g., the magnetic moment 107). The apparatus further includes means (e.g., the second free layer 110) for generating a second oscillating magnetic moment (e.g., the magnetic moment 111). The apparatus further includes means for antiferromagnetically coupling (e.g., the AF coupling layer 108) the means for generating the first oscillating magnetic moment and the means for generating the second oscillating magnetic moment. The means for perpendicularly polarizing, the means for generating the first oscillating magnetic moment, the means for generating the second oscillating magnetic moment, and the means for antiferromagnetically coupling are included in a spin-torque oscillator (STO) (e.g., the STO 100).

The foregoing disclosed devices and functionalities may be designed and configured into computer files (e.g. RTL, GDSII, GERBER, etc.) stored on computer readable media. One or more of the computer files may include information (e.g., design information) representing an STO (e.g., the STO 100) for selection during a circuit design process. Some or all such files may be provided to fabrication handlers who fabricate devices based on such files. The devices may include one or more STOs, such as the STO 100. Resulting products include semiconductor wafers that are then cut into semiconductor die and packaged into semiconductor chips that may include one or more STOs, such as the STO 100. The chips are then employed in devices described above (e.g., within the electronic device 500).

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the disclosure.

The steps of a method or algorithm described in connection with the embodiments disclosed herein may be embodied directly in hardware, in a software module executed by a processor, or in a combination of the two. As a particular example, one or more operations of the method 400 of FIG. 4 may be initiated or controlled using a hardware device, such as a controller, which may include a processor that executes instructions. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the disclosure is not intended to be limited to the embodiments shown herein but is to be accorded the widest scope possible consistent with the principles and novel features as defined by the following claims.

What is claimed is:

1. An apparatus comprising:
   a circuit configured to generate a first signal associated with a current magnitude between approximately 20 µA and approximately 155 µA;
   a polarizer of a spin-torque oscillator (STO), the polarizer having a perpendicular magnetic anisotropy (PMA), the polarizer configured to receive the first signal; and
   a magnetically soft oscillating region including an antiferromagnetic (AF) coupling layer coupling a first free layer to a second free layer and located between the polarizer and a reference region, the reference region configured to output a second signal tunable down to a frequency of approximately 500 MHz in response to the first signal.

2. The apparatus of claim 1, wherein the second signal is tunable between approximately 500 MHz and approximately 8 GHz in response to the first signal.

3. The apparatus of claim 1, wherein the AF coupling layer is configured to cause a first magnetic moment of the first free layer to oscillate in a first direction that is different than a second direction of oscillation of a second magnetic moment of the second free layer.

4. The apparatus of claim 1, wherein the first free layer and the second free layer have in-plane magnetic anisotropies or no particular magnetic anisotropy, and wherein the polarizer includes one or more magnetically hard perpendicular materials.

5. The apparatus of claim 1, wherein the second signal includes a particular frequency range, the particular frequency range within a particular radio frequency (RF) communications range, and wherein the particular RF communications range is associated with a particular consumer radio application.

6. The apparatus of claim 1, further comprising a spacer connected to the polarizer and to the first free layer.

7. The apparatus of claim 1, wherein the first free layer includes one or more ferromagnetic materials.

8. The apparatus of claim 1, wherein the first free layer includes a nickel-iron (NiFe) alloy or other high permeability magnetic material.

9. The apparatus of claim 1, wherein the AF coupling layer includes a metal material.

10. The apparatus of claim 1, wherein the AF coupling layer includes iridium (Ir), ruthenium (Ru), chromium (Cr), or a combination thereof.

11. The apparatus of claim 1, wherein the second free layer includes an iron-based material.

12. The apparatus of claim 1, wherein the second free layer includes a cobalt-iron-boron (CoFeB) material, a cobalt-iron (CoFe) material, elemental iron (Fe), or a combination thereof.

13. An apparatus comprising:
   means for generating a first signal associated with a current magnitude between approximately 20 µA and approximately 155 µA;
   means for perpendicularly polarizing electrons, the means for perpendicularly polarizing electrons configured to receive the first signal; and
   means for coupling a reference region to another layer, the means for coupling including:

means for generating a first oscillating magnetic moment;

means for generating a second oscillating magnetic moment; and means for antiferromagnetically coupling the means for generating the first oscillating magnetic moment and the means for generating the second oscillating magnetic moment, the means for perpendicularly polarizing, the means for generating the first oscillating magnetic moment, the means for generating the second oscillating magnetic moment, and the means for antiferromagnetically coupling included in a spin-torque oscillator (STO), the STO configured to generate a second signal tunable down to a frequency of approximately 500 MHz in response to the first signal.

14. The apparatus of claim 13, wherein the means for perpendicularly polarizing includes a polarizer having a perpendicular magnetic anisotropy (PMA), and wherein the reference region includes a first reference layer and a second reference layer.

15. The apparatus of claim 13, wherein the means for generating the first oscillating magnetic moment includes a first free layer, and wherein the means for generating the second oscillating magnetic moment includes a second free layer.

16. The apparatus of claim 13, wherein:
the means for antiferromagnetically coupling includes an antiferromagnetic (AF) coupling layer, and
the second signal is tunable from approximately 500 MHz to approximately 8 GHz in response to the first signal.

17. A method of operation of a spin-torque oscillator (STO), the method comprising:
generating a first signal associated with a current magnitude between approximately 20 µA and approximately 155 µA;

biasing a polarizer of the STO using a bias signal, the polarizer having a perpendicular magnetic anisotropy (PMA); and generating an oscillation signal, based on the first signal and the bias signal, using a region of the STO that is positioned between the polarizer and a reference region and that includes a first free layer, a second free layer, and an antiferromagnetic (AF) coupling layer, the oscillation signal having a frequency that is tunable down to a frequency of approximately 500 MHz.

18. The method of claim 17, further comprising:
generating a first oscillating magnetic moment at the first free layer;
generating a second oscillating magnetic moment at the second free layer; and
antiferromagnetically coupling the first free layer and the second free layer using the AF coupling layer.

19. The method of claim 17, wherein the region is a magnetically soft oscillating region of the STO.

20. The method of claim 17, wherein the oscillation signal has a frequency of approximately 500 MHz to approximately 8 GHz in response to the bias signal.

* * * * *